(12) United States Patent
Theis et al.

(10) Patent No.: US 8,339,573 B2
(45) Date of Patent: Dec. 25, 2012

(54) METHOD AND APPARATUS FOR PHOTOIMAGING A SUBSTRATE

(75) Inventors: Daniel J. Theis, Mahtomedi, MN (US);
Levent Biyikli, Cedar Park, TX (US);
Jeffrey H. Tokie, Scandia, MN (US);
David L. Hofeldt, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 439 days.

(21) Appl. No.: 12/472,618

(22) Filed: May 27, 2009

(65) Prior Publication Data

US 2010/0304309 A1    Dec. 2, 2010

(51) Int. Cl.
*G03B 27/42* (2006.01)

(52) U.S. Cl. ........................................... 355/53

(58) Field of Classification Search .................... 355/53, 355/67, 75, 72
See application file for complete search history.

(56) References Cited

U.S. PATENT DOCUMENTS

| | | |
|---|---|---|
| 3,229,607 A | 1/1966 | Battaglia |
| 3,562,005 A | 2/1971 | Deangelo |
| 3,783,520 A | 1/1974 | King |
| 3,998,544 A | 12/1976 | Pass et al. |
| 4,174,174 A | 11/1979 | Hunter et al. |
| 4,190,352 A | 2/1980 | Bruning |
| 4,302,096 A | 11/1981 | Schonfeld |
| 4,801,979 A | 1/1989 | Bourgeois |
| 4,924,257 A | 5/1990 | Jain |
| 5,227,839 A | 7/1993 | Allen |
| 5,285,236 A | 2/1994 | Jain |
| 5,328,073 A | 7/1994 | Blanding et al. |
| 5,448,336 A | 9/1995 | Shiraishi |
| 5,563,867 A | 10/1996 | Gregg |
| 5,621,216 A | 4/1997 | Clarke et al. |
| 5,627,626 A | 5/1997 | Inoue et al. |
| 5,652,645 A | 7/1997 | Jain |
| 5,707,501 A | 1/1998 | Inoue et al. |
| 5,715,089 A | 2/1998 | Shiraishi |
| 5,721,606 A | 2/1998 | Jain |
| 5,739,964 A | 4/1998 | Allen |
| 5,795,299 A | 8/1998 | Eaton et al. |
| 5,923,403 A | 7/1999 | Jain |
| 5,969,800 A | 10/1999 | Makinouchi |

(Continued)

FOREIGN PATENT DOCUMENTS

JP    56-014573    2/1981

(Continued)

OTHER PUBLICATIONS

International Search Report.

(Continued)

*Primary Examiner* — Peter B Kim
(74) *Attorney, Agent, or Firm* — Melanie G. Gover

(57) ABSTRACT

A method includes providing a substrate having a layer of photosensitive material thereon and a mask having contiguous first, second, and third portions; and sequentially: i) scanning the first portion with a light beam at a first rate and subsequently impinges on the photosensitive material at an exposure zone; ii) fixing the scanning within the second portion; and iii) resuming scanning through the third portion. Throughout the process the substrate moves through the exposure zone. An apparatus for carrying out the process includes a light beam source, a mask mount, a mask stage, a conveyor assembly, and at least one optical element for manipulating the light beam into a rectangular light beam.

7 Claims, 5 Drawing Sheets

U.S. PATENT DOCUMENTS

| | | | |
|---|---|---|---|
| 6,018,383 A | 1/2000 | Dunn et al. | |
| 6,094,305 A | 7/2000 | Shiraishi | |
| 6,100,515 A | 8/2000 | Nishi | |
| 6,201,597 B1 | 3/2001 | Dunn et al. | |
| 6,281,966 B1 | 8/2001 | Kenmoku | |
| 6,304,316 B1 | 10/2001 | Jain et al. | |
| 6,312,134 B1 | 11/2001 | Jain et al. | |
| 6,538,723 B2 | 3/2003 | Hagiwara | |
| 6,607,863 B2 | 8/2003 | Irie | |
| 6,621,553 B2 | 9/2003 | Baxter et al. | |
| 6,642,997 B2 | 11/2003 | Yamada | |
| 6,665,046 B2 | 12/2003 | Nogawa | |
| 6,674,509 B2 | 1/2004 | Suzuki | |
| 6,774,983 B2 | 8/2004 | Kuchibhotla | |
| 6,795,161 B2 | 9/2004 | Ogura et al. | |
| 6,819,433 B2 | 11/2004 | Takai | |
| 6,822,727 B2 | 11/2004 | Shima | |
| 6,829,038 B2 | 12/2004 | Miwa | |
| 6,853,871 B2 | 2/2005 | Tomita | |
| 6,859,257 B2 | 2/2005 | Korenaga | |
| 6,872,952 B2 | 3/2005 | Shimada et al. | |
| 6,876,435 B2 | 4/2005 | Kataoka | |
| 6,891,175 B2 | 5/2005 | Hiura | |
| 6,903,468 B2 | 6/2005 | Korenaga | |
| 6,906,779 B2 | 6/2005 | Chan-Park et al. | |
| 6,933,098 B2 | 8/2005 | Chan-Park et al. | |
| 6,962,825 B2 | 11/2005 | Murakami | |
| 7,023,610 B2 | 4/2006 | Ohtsuki | |
| 7,057,703 B2 | 6/2006 | Emoto et al. | |
| 7,084,957 B2 | 8/2006 | Fukagawa | |
| 7,095,481 B2 | 8/2006 | Morohoshi | |
| 7,098,992 B2 | 8/2006 | Ohtsuki et al. | |
| 7,158,210 B2 | 1/2007 | Iizuka et al. | |
| 7,165,959 B2 | 1/2007 | Hunter et al. | |
| 7,186,483 B2 | 3/2007 | Sreenivasan et al. | |
| 7,217,503 B2 | 5/2007 | Saitoh et al. | |
| 7,296,717 B2 | 11/2007 | Swanson et al. | |
| 7,351,914 B2 | 4/2008 | Kaneto et al. | |
| 7,400,457 B1 | 7/2008 | Cayer | |
| 2001/0000974 A1 | 5/2001 | Hazelton et al. | |
| 2001/0038959 A1* | 11/2001 | Ebihara | 430/30 |
| 2002/0024646 A1 | 2/2002 | Hiura | |
| 2003/0152849 A1 | 8/2003 | Chan-Park et al. | |
| 2005/0088640 A1* | 4/2005 | Eib et al. | 355/77 |
| 2006/0210714 A1 | 9/2006 | Huizinga et al. | |
| 2008/0032209 A1 | 2/2008 | Imken | |
| 2008/0171422 A1 | 7/2008 | Tokie et al. | |
| 2009/0268186 A1 | 10/2009 | Mino et al. | |

FOREIGN PATENT DOCUMENTS

| | | |
|---|---|---|
| WO | WO 2007/008992 | 1/2007 |

OTHER PUBLICATIONS

Jain et al., "Flexible Electronics and Displays:High-Resolution, Roll-To-Roll, Projection Lithography and Photoablation Processing Technologies for High-Throughput Production", Proceedings of the IEEE, vol. 93, No. 8, pp. 1500-1510 (Aug. 2005).

Woznicki, "Reeeeeally Big Flex Circuits", The Flex Circuit News, Flex Circuit Design Company, downloaded from http://www.flexdude.com/Current%20Issue/FCN06-08.PDF, pp. 1-6 (Jun. 2008).

Haase et al., U.S. Appl. No. 61/140,248, "Roll-to-Roll Digital Photolithography", filed Dec. 23, 2008.

Carlson et al., U.S. Appl. No. 61/141,308, "Apparatus and Method for Making Fiducials on a Substrate", filed Dec. 30, 2008.

Carlson et al., U.S. Appl. No. 61/141,128, "Phase-locked Web Position Signal Using Web Fiducials", filed Dec. 29, 2008.

* cited by examiner

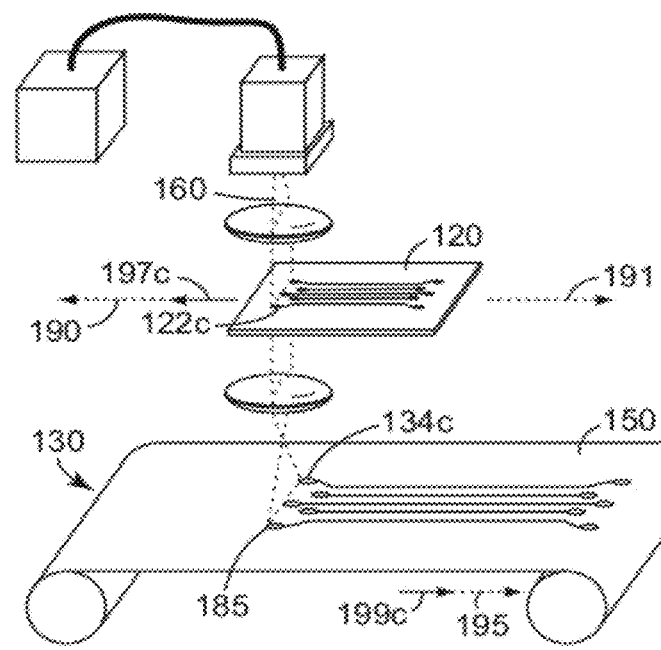
Fig. 1C
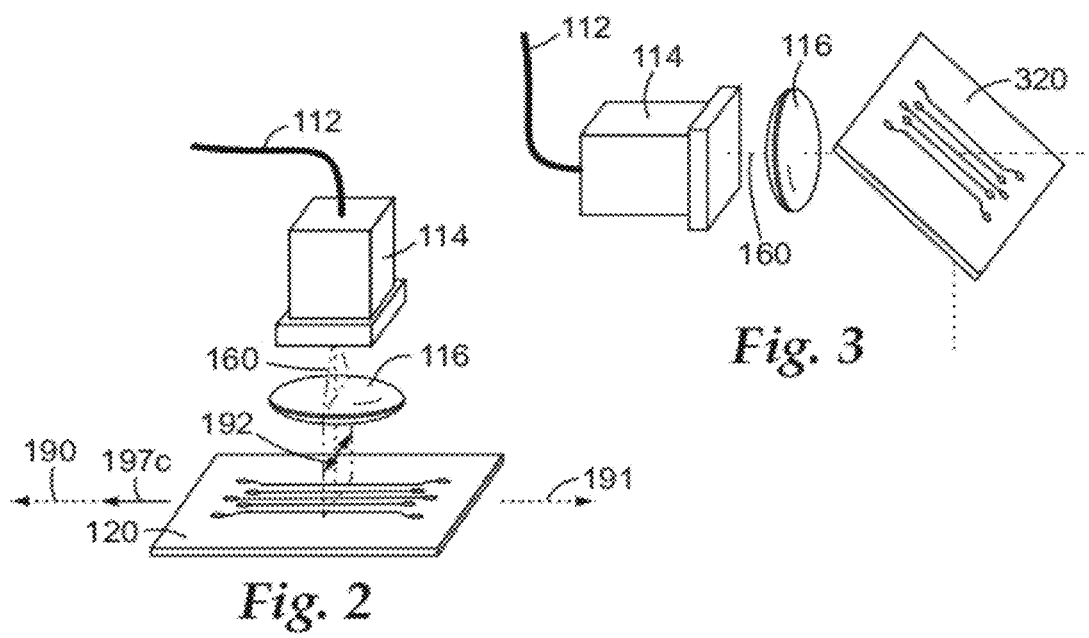
Fig. 2
Fig. 3

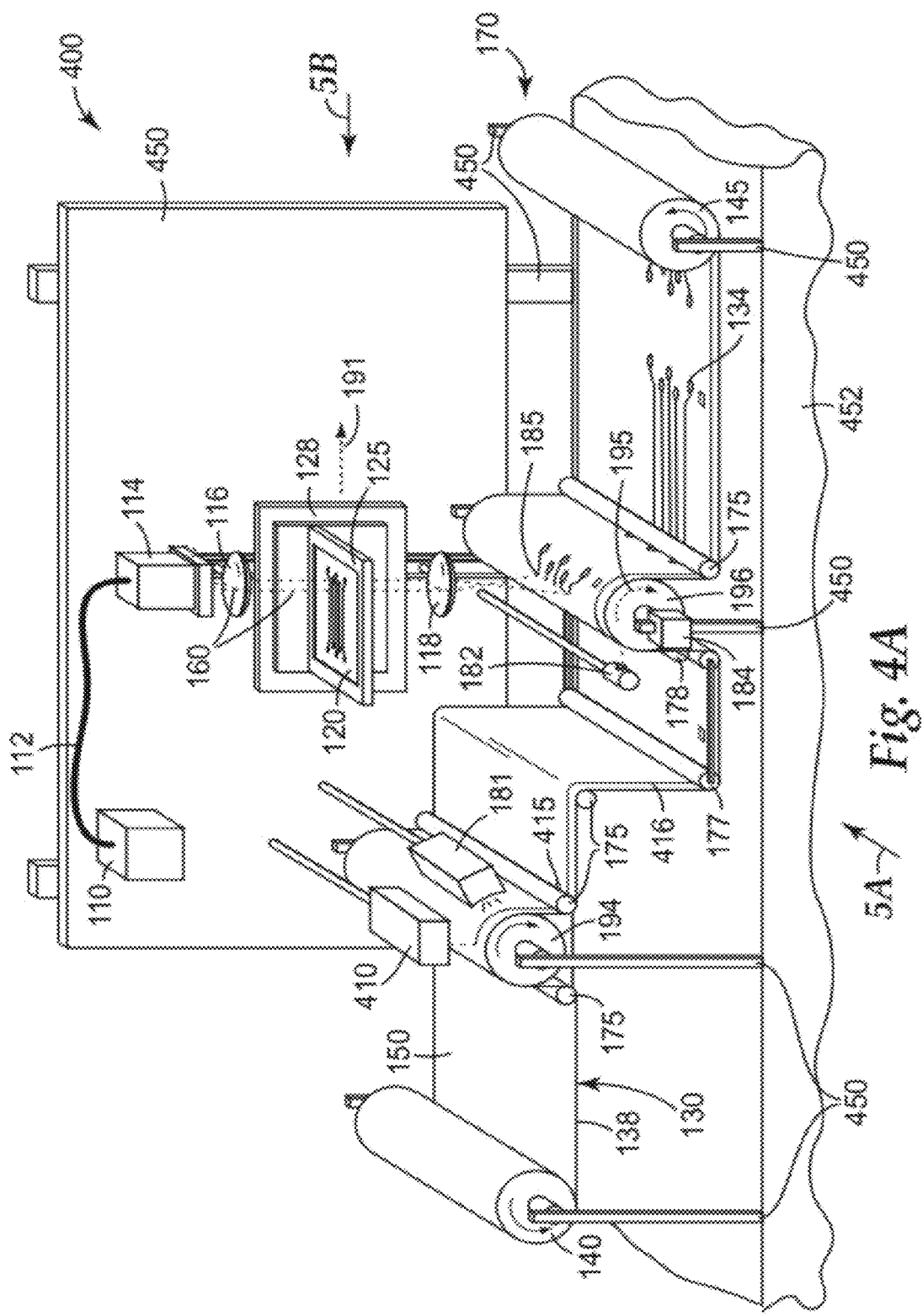

METHOD AND APPARATUS FOR PHOTOIMAGING A SUBSTRATE

TECHNICAL FIELD

The present disclosure broadly relates to apparatus and methods for photoimaging, and articles manufactured thereby.

BACKGROUND

Conventional roll-to-roll lithography systems often use "step and repeat" indexing to bring a substrate with a photosensitive coating or laminate into the exposure area. A mask (also known as a "phototool") has an image that is typically the full size of the exposure area, and the full area is exposed simultaneously using a broad spectrum ultraviolet and/or visible light source as the substrate is held motionless on vacuum tooling. In order to make long circuits, the circuit must either be fully incorporated within the exposure area or be made from multiple steps or indexes of the exposure cycle. Both of these methods result in processes that make circuits that are longer than the exposure area.

One conventional method to make long circuits is to expose a circuit in a serpentine pattern that fits within the exposure area. This serpentine circuit is subsequently folded into a linear band of conductors. One problem with such a folded circuit design is the resulting periodic thick cross sections that reduce the number of conductive traces capable of being included into a catheter or other device.

A second conventional method to make long circuits involves a multi-step approach wherein multiple mask-derived images representing portions of the long circuit may be joined together. Such long circuits are the result of multiple step exposures, which can result in misalignment error. Such misalignment typically causes narrow bands in conductive traces thereby creating hotspots or fusible links in the circuit.

SUMMARY

In one aspect the present disclosure provides a method comprising:

providing a substrate comprising a carrier supporting a layer of photosensitive material;

providing a mask comprising an image, the image comprising contiguous first, second, and third image portions; and sequentially:

i) directing a light beam onto the mask such that it scans the first image portion along a first direction at a first rate and subsequently impinges on the layer of photosensitive material at an exposure zone while the substrate advances through the exposure zone along a second direction at a second rate;

ii) directing the light beam onto the mask such that it impinges on the second image portion at a third rate and subsequently impinges on the layer of photosensitive material in the exposure zone while the substrate advances through the exposure zone along the second direction at a fourth rate; and iii) directing the light beam onto the mask such that it scans the third image portion along the first direction at a fifth rate and subsequently impinges on the layer of photosensitive material at the exposure zone while the substrate advances through the exposure zone along the second direction at a sixth rate, wherein the first rate and the fifth rate are greater than the third rate.

In some embodiments, the first direction is linear. In some embodiments, the first rate equals the fifth rate, and the second rate, the fourth rate, and the sixth rate are equal. In some embodiments, the first rate is proportional to the second rate. In some embodiments, the first rate equals the second rate. In some embodiments, the third rate is zero.

In some embodiments, the substrate is maintained in contact with a roll while in the exposure zone. In some embodiments, the substrate is maintained in a planar configuration in the exposure zone. In some embodiments, the photosensitive material comprises a photoresist. In some embodiments, the light beam passes through the mask. In some embodiments, a portion of the light beam reflects off the mask and is directed onto the photosensitive material. In some embodiments, the light beam forms a thin sheet and is directed onto the photosensitive material. In some embodiments, the light beam is raster scanned.

In some embodiments, the substrate comprises a dielectric carrier having a metallic layer disposed on at least a portion of the dielectric carrier. In some of those embodiments, a photoresist is disposed on at least a portion of the metallic layer. In such embodiments, the method may further comprise developing the photoresist to expose a portion of the metallic layer, and etching away the exposed portion of the metallic layer to provide at least one conductive trace. Residual photoresist (i.e., photoresist remaining after development) may be removed from the substrate to expose the conductive traces, and a protective layer may be disposed over at least the exposed conductive traces.

In some embodiments, the carrier comprises a polymer film and is flexible.

In another aspect, the present disclosure provides an apparatus comprising components:

a) a source for producing a light beam;

b) a mask mount adapted to receive a mask and capable of advancing along a linear first direction at a first rate, a second rate, and a third rate, wherein the mask comprises an image, and wherein the first image comprises contiguous first, second, and third image portions;

c) a mask stage in communication with the mask mount and capable of translating at each of the first rate, the second rate, and the third rate;

d) a conveyor assembly for advancing a substrate at a fourth rate through an exposure zone along a second direction, the substrate comprising a carrier and a layer of photosensitive material; and e) at least one optical element for directing the light beam to impinge on the mask such that the light beam is subsequently directed onto the photosensitive material in the exposure zone.

In some embodiments, the apparatus further comprises a frame having components a) to e) affixed thereto.

In some of embodiments, the apparatus further comprises: f) a conveyor assembly controller in communication with the conveyor assembly and capable of varying the fourth rate. In some of these embodiments, the apparatus further comprises a frame having components a) to f) affixed thereto. In some embodiments, the light beam is reflected off the mask. In some embodiments, the at least one optical element directs the light beam in a raster pattern. In some embodiments, the apparatus further comprises a computer in electrical communication with conveyor assembly controller and the mask stage.

Advantageously, methods and apparatus according to the present disclosure are useful; for example, for preparing articles (e.g., flexible circuits) with elongated dimensions (e.g., for medical catheters) that may exceed the dimensions available using conventional techniques. Moreover, according to methods of the present disclosure no folding of circuits is required to produce flexible circuits of indefinite length, which may be formed in a continuous, uniform, and uninterrupted manner.

As used herein, the term "rate" as applied to the first through fifth rates discussed herein, refers to a nominal rate that may have slight fluctuations in value consistent with process tolerances (e.g., mechanical and software tolerances). Hence, two rates may be equal even though at a given time they may be slightly different. Additionally, the precision of the process is generally limited by additive tolerances in the equipment (e.g., scanning optics) and parameters (e.g., the various rates) of the process. In general, such tolerances may be less than 1 percent, less than 0.1 percent, or even less than 0.01 percent.

As used herein, the term "scan" as applied to the interaction of the light beam and the mask and image refers to relative movement of the light beam in a systematic pattern over the image.

BRIEF DESCRIPTION OF THE DRAWINGS

FIGS. 1A-1C are schematic diagrams depicting an exemplary process according to the present disclosure;

FIG. 2 is a schematic diagram showing one exemplary configuration of light beam 160;

FIG. 3 is a schematic diagram showing one exemplary configuration of light beam 160;

FIGS. 4A and 4B are schematic diagrams depicting an exemplary apparatus according to the present disclosure.

DETAILED DESCRIPTION

Figure 1A:
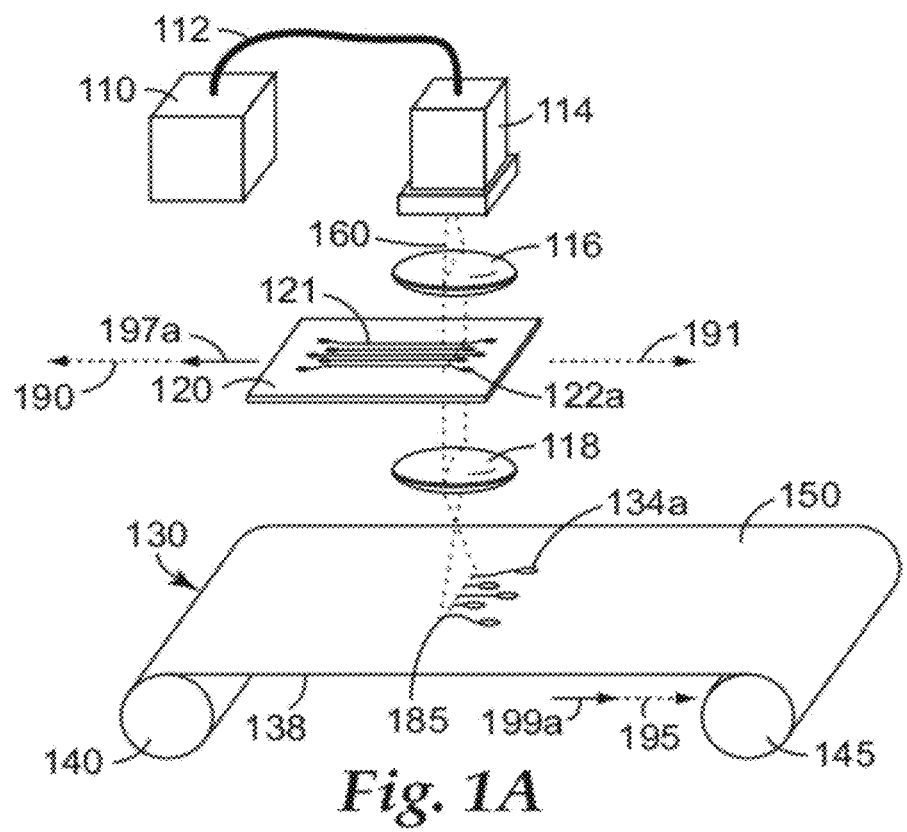
Figure 1B:
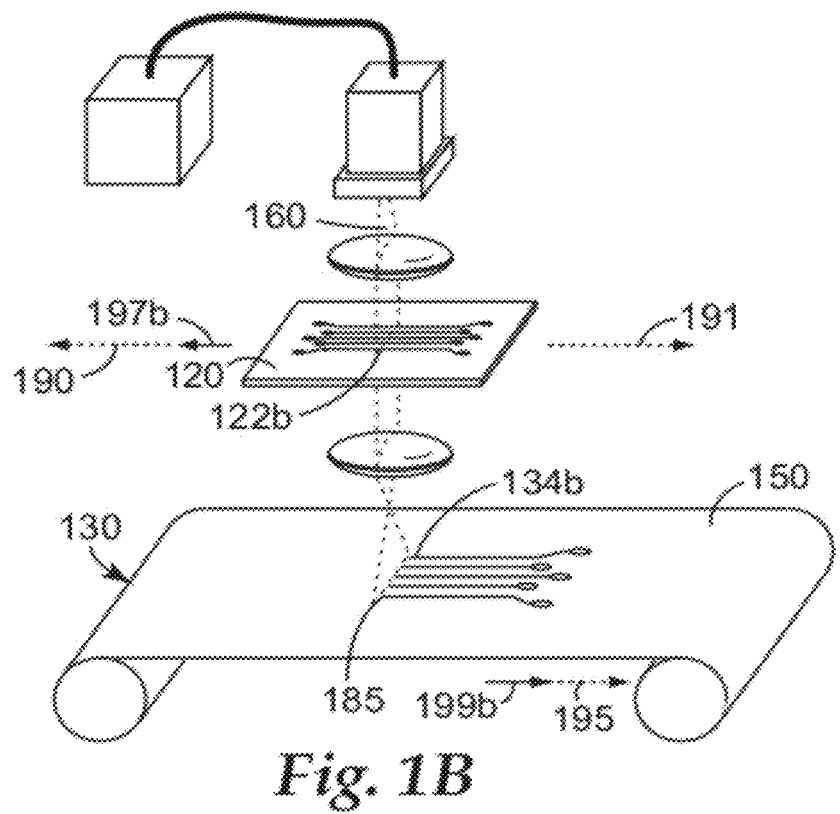

An exemplary method according to the present disclosure includes the sequential steps shown in FIGS. 1A-1C.

Referring now to FIGS. 1A-C, substrate 130 comprises carrier 138 supporting a layer of photosensitive material 150. Mask 120 comprises an image 121 comprising contiguous first, second, and third image portions (122a, 122b, 122c, respectively). In a first step, light beam 160, produced by source 110, is directed through the optical elements of a light fiber 112, light fiber coupler/beam shaper 114 and spherical lens 116 where it emerges as a sheet that is directed onto mask 120 such that it scans a first image portion 122a along a first direction 190 at a first rate 197a. It is noted that for a moving mask design, first direction 190 is opposite to the linear direction 191 of the motion of the mask. In the embodiment shown, the light beam passes through mask 120, then projection lens 118, and subsequently impinges on layer of photosensitive material 150 at an exposure zone 185 while substrate 130 advances through exposure zone 185 along a second direction 195 at a second rate 199a. During this step, a first pattern portion 134a, which may be apparent or latent, corresponding to first image portion 122a, is formed in the layer of photosensitive material 150. As shown, substrate 130 is supplied from unwind roll 140 and advanced through exposure zone 185 by take up roll 145.

In a second step, illustrated in FIG. 1B, light beam 160 is directed onto mask 120 such that it scans second image portion 122b along first direction 190 at a third rate 197b and subsequently impinges on layer of photosensitive material 150 at exposure zone 185. In this step, light beam 160 impinges on second image portion 122b. Light beam 160 and second image portion 122b may be fixed with respect to each other along first direction 190 (i.e., third rate equals zero), or they may be scanned relative to one another as in the first step but at a slower rate, while substrate 130 advances through exposure zone 185 along second direction 195 at a fourth rate 199b creating second pattern portion 134b.

In a third step, illustrated in FIG. 1C, light beam 160 is directed onto mask 120 such that it scans the third image portion 122c along first direction 190 at a fifth rate 197c and impinges on the layer of photosensitive material 150 at exposure zone 185 while substrate 130 advances through exposure zone 185 along second direction 195 at a sixth rate 199c creating third pattern portion 134c.

First rate 197a and fifth rate 197c are each greater than third rate 197b. In one simple and useful embodiment, the third rate is zero and the second rate, fourth rate, and sixth rate are equal.

The net effect of these steps is to generate a pattern having first, second, and third pattern portions in the layer of photosensitive material, generally corresponding to the first, second, and third image portions of the image of the mask, but with the second pattern portion being elongated relative to the second image portion. While the image may be an apparent image such as, for example, a visible graphic image, more typically, the image is a latent image that needs a developing step to be fully realized. For example, the layer of photosensitive material may comprise a photographic emulsion or a photoresist (e.g., a positive acting or negative acting photoresist) that requires a subsequent developing step. In some embodiments, the layer of photosensitive material may comprise multiple layers of photoresists. In the case of a photoresist, typical development steps include, for example, using a developer solution to dissolve away unexposed portions (in the case of a negative acting photoresist) or exposed portions (in the case of a positive acting photoresist) of the layer of photosensitive material.

Useful carriers may comprise any material capable of supporting the layer of photosensitive material; for example, paper, glass, ceramic, metal, and/or a polymer film. Preferably, the carrier is flexible and substantially dimensionally stable. In some embodiments, the carrier may comprise a dielectric polymer film. Examples include films comprising: liquid crystal polymers; polyvinyl chloride; acrylics; polycarbonates; polyolefins (e.g., polyethylene and polypropylene); polyesters such as polyethylene terephthalate (PET) and polyethylene naphthalate (PEN); polyimides, poly(ether ether ketone) (PEEK), and polyether imide (PEI). In cases wherein conductivity of the carrier is not a factor, metal foil may be useful as a carrier. The carrier may have any thickness; for example, a thickness of about 10 micrometers to about 1 millimeter. The carrier may be rigid or flexible, preferably sufficiently flexible to be handled with web handling equipment such as, for example, rollers. The carrier may include one or more treatments such as, for example, an adhesion promotion layer such as a primer layer or a tie layer, or a plasma surface treatment. The carrier may be a composite of several layers such as for example, a composite polymer film.

Preferably, the light beam will cause a detectable color change in the layer of photosensitive material that can be detected by an optical recognition and alignment mechanism, which is present in some commercial photoimaging equipment. In some embodiments, the substrate can be inscribed with one or more fiducials that include, for example, laser marking, printing, punching, or etching. Accordingly, as the substrate advances, a fiducial mark is sensed and the substrate is actively aligned to a desired position.

In some embodiments, the carrier comprises a conductive metallic layer sandwiched between a polymer film (optionally coated with a tie layer) and the layer of photosensitive material. Exemplary metals include copper, aluminum, chromium, nickel chrome, gold, palladium, platinum, silver, tin, and alloys thereof). Optionally, the deposited conductive metallic layer(s) can be plated up further to a desired thickness by known electroplating or electroless plating processes. Alternatively, a suitable laminate may be formed by adhering a metal foil to the carrier with an adhesive. The conductive metallic layers can be patterned by a number of well known methods including various photolithography methods, such as ultraviolet and/or visible light exposure through the mask.

In cases wherein the photosensitive material comprises a photoresist, the photoresist is exposed to actinic radiation (e.g., deep ultraviolet, ultraviolet and/or visible light) through the mask. For a negative photoresist the exposed portions are typically crosslinked and the unexposed portions of the photoresist are then developed with the appropriate solvent. Next, the exposed portions of the metallic layer are typically etched away using an appropriate etchant such as, for example, an inorganic acid (e.g., sulfuric acid or nitric acid) optionally combined with an organic acid (e.g., acetic acid).

Residual photoresist not removed during the developing process may be removed at this point using an appropriate solvent (e.g., a solvent recommended by the photoresist manufacturer). This exposes that portion or portions of the metallic layer remaining after etching (e.g., corresponding to a positive or negative image of the pattern formed on the photosensitive material during the exposure step).

If a covercoat is desired, it can be applied to one or both surfaces of the substrate, either in a single step or two separate steps, using standard coating or laminating techniques. The covercoat can be used, for example, to protect the conductive traces, or define an exposed area by creating an opening or edge boundary. Exemplary covercoats include acrylics and/or epoxies.

Another possible method of forming conductive traces uses semi-additive plating and the following typical step sequence: A carrier (optionally having a tie layer thereon) is overlaid with a thin layer of metallic or electroless plating catalyst. If photolithography is used to pattern the metallic layer of the electroless plating catalyst, a photoresist which may be aqueous or solvent based, and may be negative or positive, is then applied, exposed, and developed as discussed above. The exposed portions of the conductive metallic layer(s) may then be further plated using standard electroplating or electroless plating methods until the desired circuit thickness is achieved. The cross-linked exposed portions of the resist are then stripped off both sides of the laminate. Subsequently, the original thin first conductive and tie layers are etched where exposed with a suitable etchant. If desired, the circuits can then be further processed as previously described.

While the steps depicted in FIGS. 1A-1C are carried out sequentially, they need not be carried out consecutively, although they may be carried out consecutively if desired.

The light beam may be formed into a light sheet and scanned across the image as shown in FIGS. 1A-1C. Alternatively, as shown in FIG. 2, light beam 160 may be scanned back and forth in a direction having a component 192 perpendicular to first direction 190 (for example, in a raster pattern) at a rate substantially faster than the corresponding scan rate (e.g., 197a, 197b, and 197c) of image 121 along first direction 190, thereby achieving effectively the same result as a light sheet.

The mask may be optically transmissive (e.g., transparent or translucent) as shown in FIGS. 1A-1C). Alternatively, light beam 160 may be reflected off mask 120 and subsequently directed onto the layer of photosensitive material 150.

As used herein, the term "mask" refers to a film or sheet that is selectively transmissive and/or reflective to actinic radiation such as, for example, ultraviolet (including deep ultraviolet) and/or visible light. Examples include a chrome-coated glass or artwork film (e.g., a phototool) of a fixed dimension that has a negative or positive image of the pattern that is to be made. Stencils (e.g., metal stencils) or polymer masks may also be used as masks.

Whatever type of mask, it comprises an image that has at least three contiguous portions, Referring now to FIGS. 1A-1C, image 121 has first image portion 122a (e.g., a head portion, shown in FIG. 1A), second image portion 122b (e.g., a body portion, shown in FIG. 1B), and third image portion 122c (e.g., a tail portion, shown in FIG. 1C). The image may comprise additional portions. The mask may comprise more than one discrete image. The image may be transmissive, reflective, or opaque (if surrounded by a transmissive region).

FIG. 3 shows an exemplary alternative arrangement of light fiber 112, light fiber coupler/beam shaper 114, and spherical lens 116 to direct light beam 160 onto reflective mask 320.

In general, the mask should not contact the substrate, although a minor amount of contact may be tolerable in some cases. Nonetheless, the mask may be placed in close proximity (e.g., a shadow mask), typically as long as the substrate and mask can move independently during scanning of the image. The mask may have any size, but advantageously the mask may be relatively small (e.g., 1 to 20 centimeters in length), while the pattern created on the substrate may be much longer (e.g., 0.5 to 10 meters in length).

Typically, the mask is placed in a mask mount that firmly positions the mask, and which in turn is affixed to a positionable mask stage. The mask stage typically includes a drive mechanism (e.g., a servo motor) that is capable of positioning the mask stage, and therefore the mask, relative to the light beam. Accordingly, the mask stage may receive instructions from a mask stage controller, which may include a computer and/or other circuitry. It will also be recognized that, in an alternative embodiment, the mask may be immobilized and the light beam scanned across it if appropriate optical elements (e.g., rotating mirrors) are used.

The conveyor may have any suitable configuration as long as it is capable of conveying the substrate through the exposure zone. Typically, the conveyor has a drive mechanism (e.g., a drive roll) and typically a conveyor controller in communication with the drive mechanism which may variably control the rate of the substrate as it travels through the conveyor (along the substrate path) including the exposure zone. The conveyor path may be flat as it passes through the exposure zone. Likewise, the conveyor path may be curved (e.g., around a roll) as it passes through the exposure zone.

Preferably, the drive mechanism of the conveyor is capable of high precision position control (e.g., a servo motor driven roll with precision feedback), especially if the substrate comprises a web. Briefly, the approach of using a drive roll of sufficient precision and feedback resolution includes precisely guiding the substrate as it passes onto the roll. Precise web guiding generally requires using a fiducial guide line, as opposed to using the edge of the web as a guide reference. The precision guiding onto the drive roll provides reliable positioning of the substrate and, by extension, reliable positioning of patterns on the substrate in the cross web direction. Down web fiducial marks can be detected on the web as the substrate is guided onto the drive roll and frictionally constrained. Precision patterning and registration of those patterns is achieved by the combination of simultaneous cross web guiding and down web fiducial tracking while the web is constrained by the by the drive roll to substrate interface.

The light beam may be generated by any suitable source of actinic radiation such as a laser or lamp, which may be fiber-coupled to a train of optical elements that manipulate the light beam shape and/or direction. Exemplary light sources include flash lamps, mercury lamps, light emitting diodes, and lasers (e.g., solid state lasers, dye lasers, gas excimer lasers). The light beam emanating from the light source may be formed using one or more optical elements into a thin sheet, typically substantially perpendicular to the mask and substrate in the exposure zone, although this is not a requirement. In another configuration, the light beam may be scanned over the mask with stepping to form a raster pattern (i.e., raster scanned). Various optical elements are used to manipulate the shape, focus, and direction of the light beam. Examples include mirrors, diffractive optical elements, lenses (e.g., spherical lenses and plano-concave cylindrical lenses), and prisms. In one exemplary configuration, a solid state laser is fiber-coupled to a collimator. The light beam is directed to a plano-concave lens, and then a spherical lens focused on a portion of the mask. After interacting with the mask, the light beam is picked up by a second spherical lens and projected onto the substrate.

The rate of scanning the mask with the light beam and the rate of the substrate movement are preferably synchronously controlled. The mask rates (first, third, and fifth rates) and the rate of travel of the substrate (second, fourth, and sixth rates) are preferably synchronously controlled. Since depending on the sensitivity of the photosensitive material and the optical elements chosen, the image of the mask may be magnified or reduced to form the pattern on the substrate, the various rates of scanning the mask and movement of the substrate are typically proportional (except of the second rate which may be zero). In some cases at least some of the rates may be identical.

Typically, the various hardware components used in practice of the present disclosure are affixed to at least one frame that maintains their relative configuration.

An exemplary apparatus according to the present disclosure is shown in FIG. 4A. Exemplary apparatus 400 comprises source 110 for producing light beam 160. The optical elements (light fiber 112, light fiber coupler/beam shaper 114, spherical lens 116, and projection lens 118) are as previously described. One suitable light fiber coupler/beam shaper 114 is available from StockerYale, Inc. of Salem, N.H., as a Diverging Flat Top Beam Shaper having a 23 millimeters sheet length, 50 micron sheet width.

Mask mount 125 is adapted to receive mask 120 and is capable of advancing along a linear direction 191 at various rates. Mask mount 125 may comprise an aperture or transparent window and/or it may comprise a clamp or other mount designed to securely position the mask. Mask mount 125 is securely affixed to mask stage 128 and is capable of advancing along a linear direction 191 at various rates, thereby positioning mask 120 with respect to light beam 160.

Conveyor assembly 170 advances substrate 130 through exposure zone 185 along a second direction 195. In this embodiment, conveyor assembly 170 comprises unwind roll 140 and take up roll 145, tension sensing rollers 175, and steering roller assembly 177. Steering roller assembly 177 is controlled by steering mechanism 184 through steering guide 178. Fiducial sensor 182 detects fiducial 415 information to ensure proper down web positioning of substrate 130.

To facilitate web handling, apparatus 400 optionally includes a marking device 410 that applies a guideline 416 and at least one fiducial 415 to substrate 130 as it passes around marking roll 194. In the embodiment shown, a curing unit 181 dries the ink used to mark the substrate. Examples of curing units include infrared dryers and air dryers.

Similarly, substrate 130 is passed around exposure roll 196 where it travels through exposure zone 185 generating pattern 134. In this context, the second direction 195 traveled by the substrate 130 through exposure zone 185 is arcuate. Alternative designs in which no exposure roll is present are also possible and useful.

A conveyor assembly controller (not shown) is in communication (e.g., electrical, hydraulic, and/or mechanical communication) with the conveyor assembly and is capable of varying the rate that the substrate travels through the exposure zone. The conveyor assembly controller may include a computer and/or additional circuitry.

In the embodiment shown, the various components are affixed to frames 450 which is secured to base 452, although a single frame or no frame could be also be used. Optionally, the conveyor assembly controller (not shown) and the mask stage 128 may be in communication with a computer (not shown). This allows an operator to be remotely located from the apparatus.

Figure 4B:
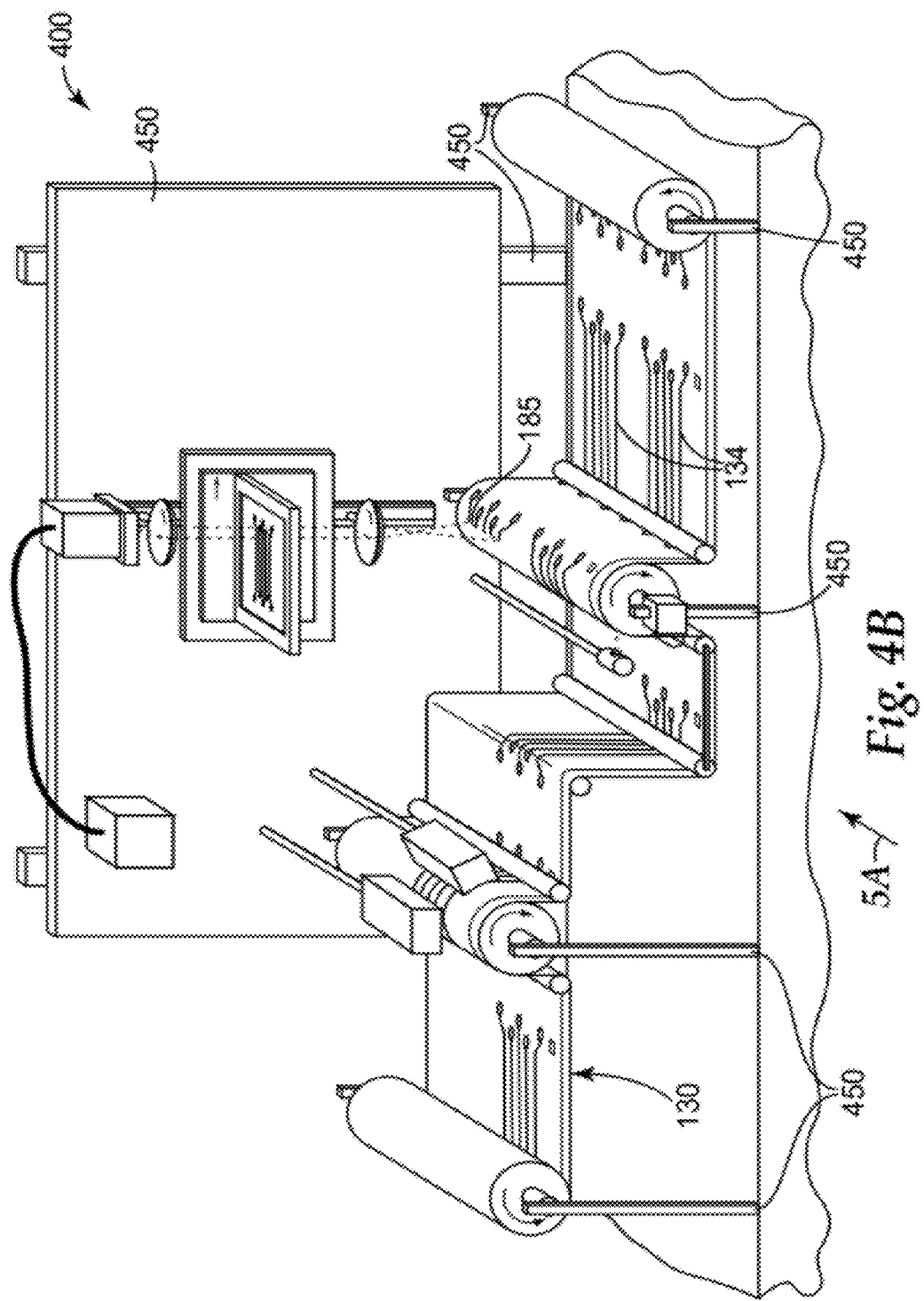
Figure 5A:
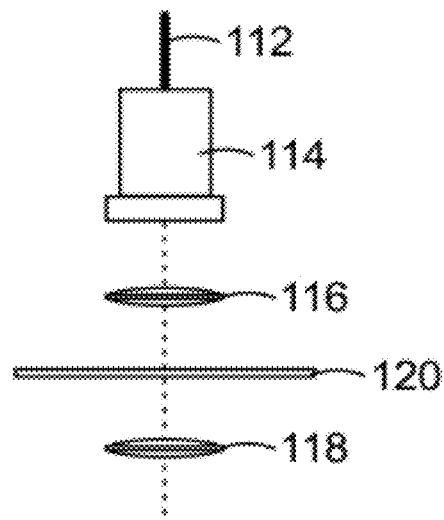
FIGS. 5A and 5B are schematic diagrams showing the configuration of light beam 160 along sight lines 5A and 5B, respectively.
Figure 5B:
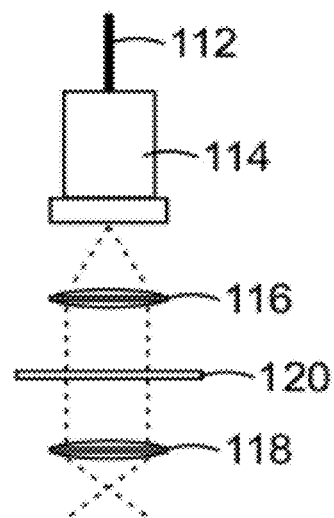

FIGS. 5A and 5B depict the configuration of light beam 160 used by exemplary apparatus 400 shown in FIG. 4A as viewed along sight lines 5A and 5B, respectively.

Referring now to FIG. 4B, it will be appreciated that the substrate 130 may be passed through exposure zone 185 multiple times (e.g., advanced and rewound) while adjusting the mask position along sight line 5A between passes. By this method several patterns 134 can be placed on the substrate without need of additional mask(s).

It will be recognized that for purposes of clarity FIGS. 4A and 4B have been drawn with frame 450 positioned only toward the back of the device, and that in many configurations a similar frame component (e.g., a mirror image of frame 450) may be present at the front of the device optionally with members (e.g., rods and/or struts) connecting the two frame components mechanically, and on which the various other components are mounted.

Methods and apparatuses according to the present disclosure are useful, for example, for preparing various articles, and especially those having a highly elongated dimension. Examples include high precision graphic images and flexible electrical circuits (e.g., catheters), optical waveguides, and microfluidic devices.

Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. An apparatus comprising components:
   a) a source for producing a light beam;
   b) a mask mount adapted to receive a mask and capable of advancing along a linear first direction at a first rate, a second rate, and a third rate, wherein the mask comprises an image, and wherein the first image comprises contiguous first, second, and third image portions;
   c) a mask stage in communication with the mask mount and capable of translating at each of the first rate, the second rate, and the third rate;
   d) a conveyor assembly for advancing a substrate at a fourth rate through an exposure zone along a second direction, the substrate comprising a carrier and a layer of photosensitive material; and
   e) at least one optical element for directing the light beam to impinge on the mask such that the light beam is subsequently directed onto the photosensitive material in the exposure zone thereby forming a pattern in the photosensitive material, wherein the horizontal pattern formed in the photosensitive material is longer than the mask.

2. The apparatus of claim 1, further comprising a frame having components a) to e) affixed thereto.

3. The apparatus of claim 1, further comprising:

f) a conveyor assembly controller in communication with the conveyor assembly and capable of varying the fourth rate.

4. The apparatus of claim 3, further comprising a frame having components a) to f) affixed thereto.

5. The apparatus of any one of claim 1 or claim 4, further comprising a computer in electrical communication with conveyor assembly and the mask stage.

6. The apparatus of any one of claim 1 to claim 5, wherein the light beam is reflected off the mask.

7. The apparatus of any one of claim 1 to claim 6, wherein the at least one optical element directs the light beam in a raster pattern.

* * * * *

UNITED STATES PATENT AND TRADEMARK OFFICE
CERTIFICATE OF CORRECTION

| | | |
|---|---|---|
| PATENT NO. | : 8,339,573 B2 | Page 1 of 1 |
| APPLICATION NO. | : 12/472618 | |
| DATED | : December 25, 2012 | |
| INVENTOR(S) | : Daniel J Theis | |

It is certified that error appears in the above-identified patent and that said Letters Patent is hereby corrected as shown below:

In the Claims:

Column 8
Line 57, In Claim 1, after "the" delete "first".

Signed and Sealed this
Twenty-third Day of April, 2013

Teresa Stanek Rea
*Acting Director of the United States Patent and Trademark Office*